United States Patent
Dodd et al.

(10) Patent No.: US 7,247,952 B2
(45) Date of Patent: Jul. 24, 2007

(54) OPTICAL TARGETS (75) Inventors: Simon Dodd, Corvallis, OR (US); Michael D. Miller, Philomath, OR (US); Joseph M. Torgerson, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 525 days.

(21) Appl. No.: 10/697,394

(22) Filed: Oct. 30, 2003

(65) Prior Publication Data
US 2005/0095439 A1  May 5, 2005

(51) Int. Cl.
*H01L 23/544* (2006.01)
*H01L 21/70* (2006.01)
*G01B 11/14* (2006.01)

(52) U.S. Cl. ............... 257/797; 438/401; 356/620; 257/E23.179

(58) Field of Classification Search ........... 257/797; 438/16, 401; 356/620
See application file for complete search history.

(56) References Cited

U.S. PATENT DOCUMENTS

| | | | | |
|---|---|---|---|---|
| 4,233,091 A | * | 11/1980 | Kawabe | 438/401 |
| 4,487,653 A | * | 12/1984 | Hatcher | 438/492 |
| 4,655,598 A | * | 4/1987 | Murakami et al. | 356/400 |
| 4,820,055 A | * | 4/1989 | Muller | 356/401 |
| 4,834,540 A | * | 5/1989 | Totsuka et al. | 356/401 |
| 5,114,236 A | * | 5/1992 | Matsugu et al. | 356/401 |
| 5,401,691 A | * | 3/1995 | Caldwell | 438/633 |
| 5,525,840 A | * | 6/1996 | Tominaga | 257/797 |
| 5,563,684 A | * | 10/1996 | Stagaman | 355/72 |
| 5,596,413 A | * | 1/1997 | Stanton et al. | 356/401 |
| 5,847,468 A | * | 12/1998 | Nomura et al. | 257/797 |
| 5,877,562 A | * | 3/1999 | Sur et al. | 257/797 |
| 5,893,744 A | * | 4/1999 | Wang | 438/401 |
| 5,911,108 A | * | 6/1999 | Yen | 438/401 |
| 5,963,816 A | * | 10/1999 | Wang et al. | 438/401 |
| 6,020,249 A | * | 2/2000 | Shih et al. | 438/401 |
| 6,057,206 A | * | 5/2000 | Nguyen et al. | 438/401 |
| 6,133,111 A | * | 10/2000 | Sur et al. | 438/401 |
| 6,136,662 A | * | 10/2000 | Allman et al. | 438/401 |
| 6,577,020 B2 | * | 6/2003 | Huang et al. | 257/797 |
| 6,601,314 B2 | * | 8/2003 | Machida et al. | 33/645 |
| 6,825,096 B2 | * | 11/2004 | Weis | 438/401 |

* cited by examiner

Primary Examiner—Evan Pert

(57) ABSTRACT

An optical target is provided. In one embodiment, the target is formed on a substrate. The target includes a first layer deposited below a second layer on the substrate. The second layer is deposited below a third layer on the substrate. The first layer has a topographic contour formed thereon, the first layer at least partially projecting a patterned topographical contour through the second layer to the third layer.

16 Claims, 9 Drawing Sheets

OPTICAL TARGETS

BACKGROUND

Alignment targets are optical devices that are formed integrally on, or relative to, a wafer or die containing, for example, an integrated circuit. The purpose of the target is to provide positional information about the wafer or die to be used by processing equipment or tools during wafer processing. In targets, optical contrast is used to define the target. Typically, targets are configured with a central portion that optically contrasts with an outer portion located relative to the central portion that is arranged in some identifiable configuration. The contrast and/or the configuration are used to locate or identify the target using either contrast recognition or pattern recognition. This contrast is then used by optical systems to determine the position of the target, and in turn a position on the wafer or die relative to the target.

Two optical lighting configurations are often used in conjunction with optical targets, namely indirect lighting and direct lighting. In direct lighting systems, direct light is applied substantially normal (i.e., perpendicular) to the orientation of the target. In indirect lighting systems, indirect light is applied at some angle (usually a sharp angle from the plane on which the target is formed) to the surface. In many direct lighting systems and indirect lighting systems, the detector or observer is located substantially perpendicular to the surface where the light is directed.

Relatively large dies and relatively low circuit densities are quite adaptable for the placement of these optical targets, since the optical targets can be readily located on a die in areas not occupied by the circuitry. However, current trends in integrated circuits include decreasing the die size and increasing the circuit density. Therefore, the areas occupied by the optical targets can worsen layout and routing problems for the circuitry, for example, where the electronic circuitry has to be routed around the alignment targets. For these and other reasons, there is a need for the present invention.

BRIEF DESCRIPTION OF THE DRAWINGS

The same components are used throughout the drawings to reference like features and components.

DETAILED DESCRIPTION

The methods and resultant systems described below describe optical alignment targets (i.e., optical targets). Optical targets are formed on a wafer in an integrated circuit (IC) process. Different portions of optical targets provide different optical contrasts to light. Optical contrasts can be created in optical targets by deflecting light from the surface and/or transmitting light through the surface. In certain embodiments, an optical sensor can be used to detect the contrast in light intensity between the different portions of an illuminated surface of the optical target. In other embodiments, the location of the optical targets can be visually detected by a human (either directly or through a microscope).

It is envisioned that the optical targets can be utilized in a vast variety of semiconductor wafer and die applications including (but not limited to) wafer handling, wafer processing, cutting wafers into dice, packaging of dice, and handling of the packaged dice for IC or distinct component fabrication. Though this disclosure may describe certain particular applications, it is envisioned that these target techniques can be directed to any one or more of these applications, as well as to other applications. As such, the use of optical alignment targets is applicable to all phases of handling or processing in IC and distinct components.

Figure 1:
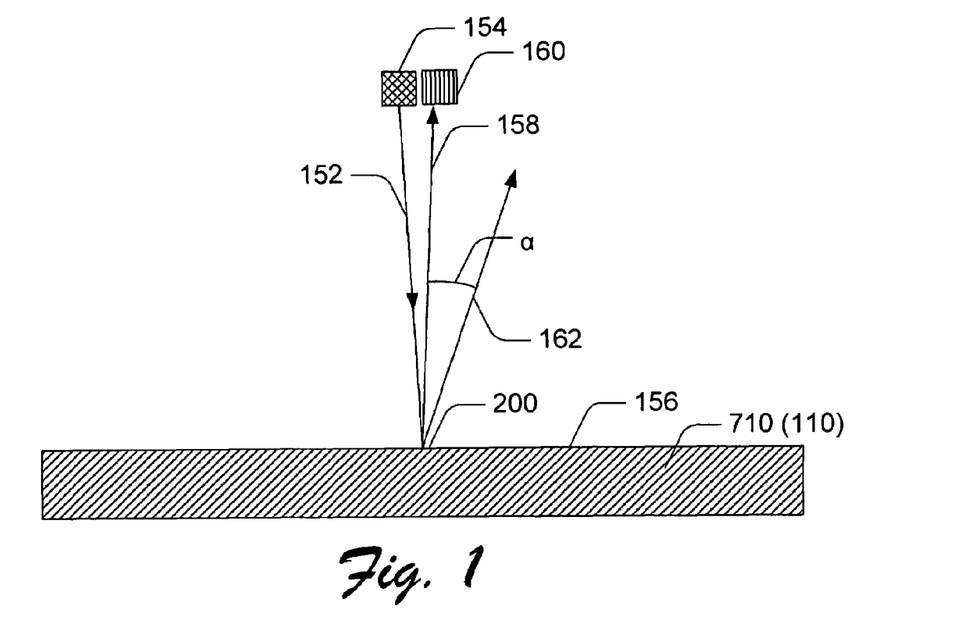
FIG. 1 is a side view of one embodiment according to the present invention of a die forming an integrated circuit (IC) that is being lit using direct lighting.
Figure 2:
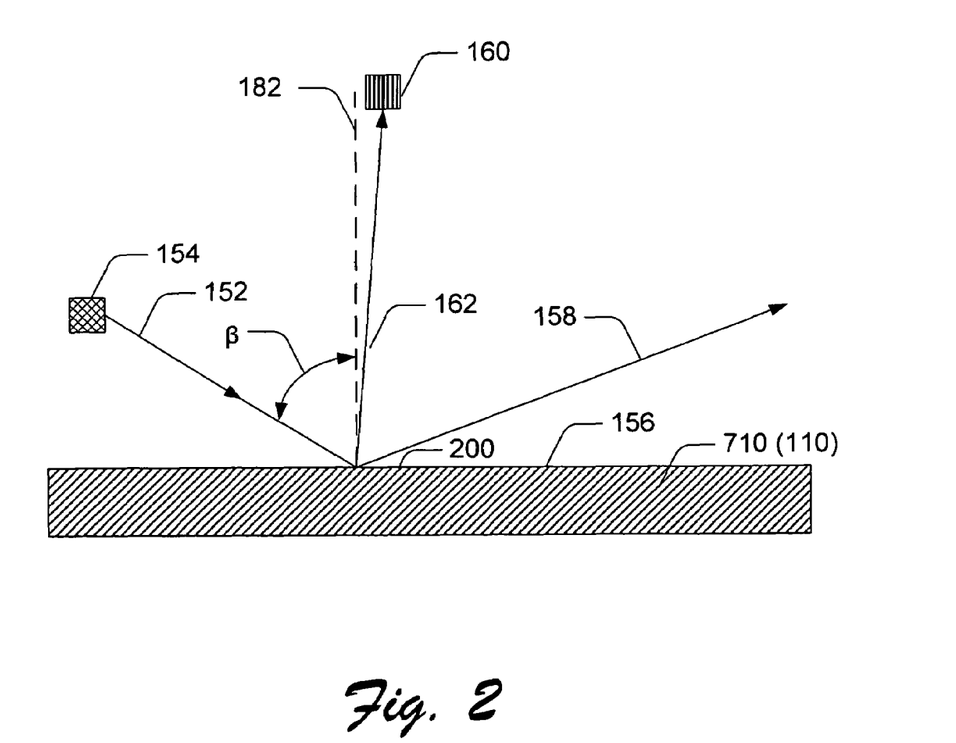
FIG. 2 is a side view of one embodiment according to the present invention of a die forming an IC that is being lit using indirect lighting.

In certain embodiments of this disclosure, optical targets may be configured to be detectable under one or both of two optical lighting configurations: indirect lighting and direct lighting. With direct lighting as illustrated in FIG. 1, direct light 152 emanating from an optical source 154 is directed substantially perpendicular (usually within 10 degrees of perpendicular) to the planar outline of the target 200. In FIGS. 1 and 2, the region in which the target 200 is located is depicted, and not the optical target 200 itself. With direct light configurations, light is directed at the optical target from a position generally overhead from the die 710. Since the observer or detector 160 is typically located above the die 710, with direct lighting light is typically directed from a location that is positioned in close proximity to the observer or detector 160.

As illustrated in FIG. 1, direct light 152 deflects off the upper surface 156 of the substrate 110 or die 710 (including the target 200). The deflected light is directed as shown by arrow 158 in the general direction of the detector 160 or an observer such that these surfaces appear bright to the detector or observer. With direct lighting, any portion of the upper surface 156 of the die 710 that is angled relative to the general planar outline of the die tends to diffract light away from the upper surface 156 towards the detector 160 at some angle α as shown by arrow 162. Such angled surfaces from which the light is diffracted away towards the observer or detector (as is the case with light traveling along a path indicated by the arrow 162) typically appear relatively darker to the detector. Therefore, these topographical contours of the surface of the die 710 can be configured in a pattern or shape that can be recognized by the detector and/or the observer.

With direct lighting, any surface that is substantially perpendicular to the direct light applied to the die (as shown in FIG. 1 as 152) will direct a relatively larger amount of light at the detector 160 or observer. In one embodiment, when direct lighting is applied, a considerable amount of the upper die surface 156 (including a portion(s) of the target) will appear relatively darker while a considerable amount of the upper die surface (including another portion(s) of the target) will appear relatively brighter. As such, the upper die surface will be well contrasted, having light and dark regions.

With indirect lighting as shown in FIG. 2, the applied light from the light source 154 is applied at a direction that is not substantially perpendicular to the upper surface of the die. With indirect lighting, the light 152 is applied from the optical source 154 to the upper surface 156 of the die 710 at some angle β that is greater than 10 degrees (e.g., typically between twenty degrees and eighty five degrees) from a perpendicular 182 to the upper surface 156 of the die 710. With indirect lighting, increasing the angle β at which the indirect lighting is applied often increases the contrast of the optical target. With both indirect lighting and direct lighting, the detector 160 or observer typically is positioned approximately perpendicular to the upper surface 156 of the die 710.

As shown in FIG. 2, light applied as indicated by path 152 at any surface that extends substantially parallel to the upper surface 156 of the die 710 will deflect in a direction 158 away from the observer or detector 160. The surfaces that are substantially parallel to the upper surface 156 will thereby appear relatively dark to the observer or detector 160. With indirect lighting, most surfaces that are angled from the upper surface 156 (including angled portions of the optical target) that are angled relative to the upper surface 156 of the die 710 also direct light in a direction away from the detector 160. Only surfaces that are angled from the upper surface within a small range of angles can reflect indirect light along a path indicated by path 162 toward a detector 160 or observer to make the surface appear relatively bright to the detector or observer. Roughened surfaces will also direct a certain percentage of light towards the detector 160.

As such, most indirect light that contacts the upper surface 156 travels along a path away from the detector 160, and therefore almost all of die surfaces under indirect light appear relatively dark to the detector or observer. With indirect lighting, only those portions of the upper surface 156 of the die 710 that are angled within a small range of angles relative to the indirect light 152 (and the upper surface 156) will deflect the light in the light path 162 towards the observer or detector 160 and thus appear relatively bright. Indirect lighting in general results in darker lighting of a greater percentage of the upper surface 156 to the detector 160 along a path that is perpendicular to the general plane of the die 710 as compared with direct lighting.

The different embodiments of the optical targets 200 (as described herein) can be of any suitable dimension considering the particular observer or detector 160. More particularly, when using a more sensitive detector 160, the dimension of the targets 200 can also be decreased while still providing the ability to be detected by a detector. The dimension and configuration of the target 200 should be sufficient to allow detection by the particular detector used. One embodiment of a target 200 has an outside cross-sectional dimension of 260 microns, but targets of any size are within the intended scope of embodiments of the present disclosure. Targets 200 can be applied on the wafer level (on a wafer) and/or on the die level (on a die). There may be one, two, or more targets 200 provided on each die. Since a plurality of dice (e.g. hundreds, such as in one case 280 dice) are typically cut from each wafer, each wafer prior to being cut into dice typically contains hundreds of targets 200.

To detect the targets 200 on the wafer/dice or the wafers, certain embodiments of a traversing mechanism (not shown) can be provided by which the detector 160 traverses relative to the upper surface 156 of the wafer/dice or vice versa. In this manner, the detector can traverse the upper surface of the wafer/die to determine the location of the optical target.

Figure 3:
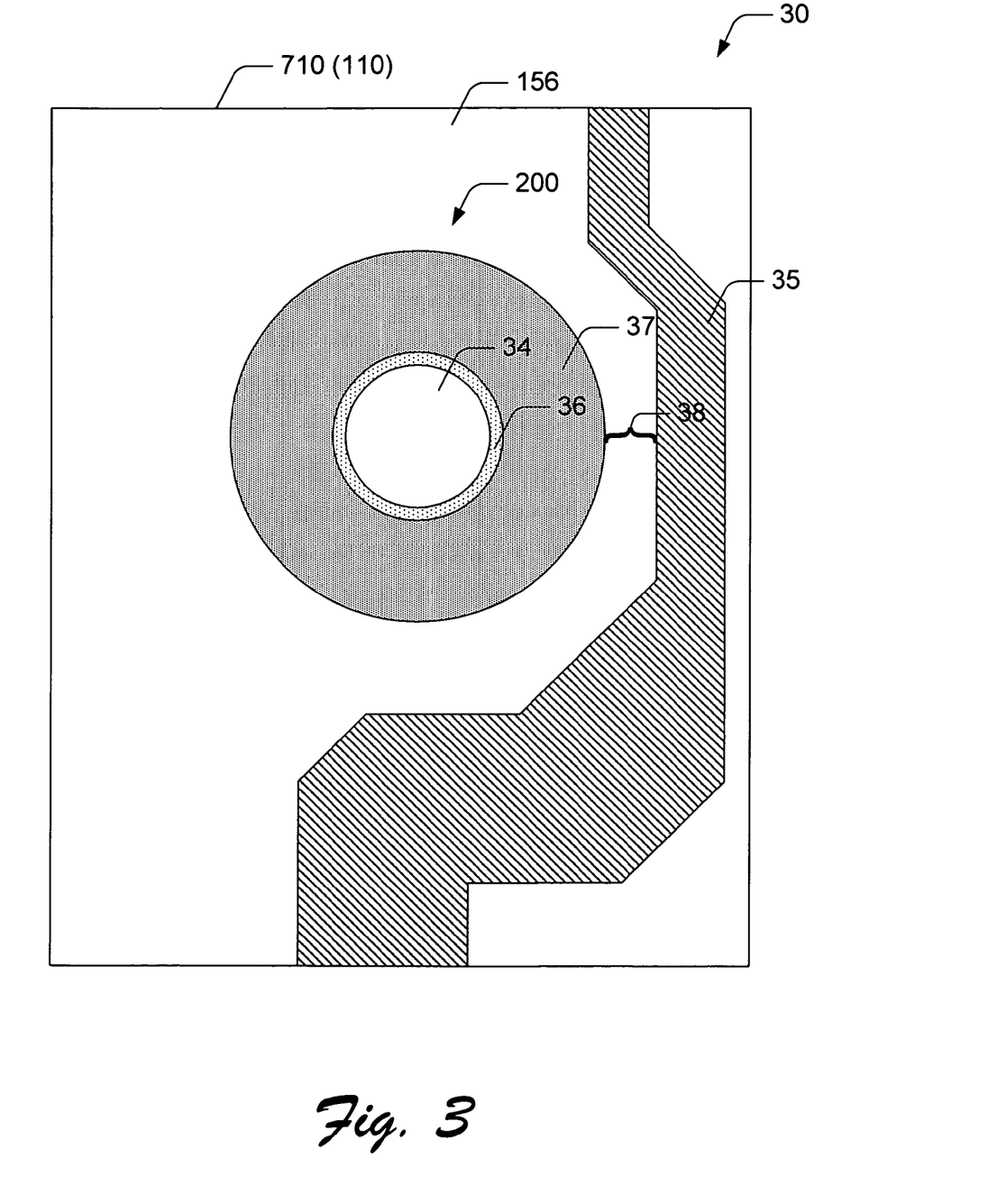
FIG. 3 is a top view of one embodiment according to the present invention of a target for use in a wafer of an IC.
Figure 4:
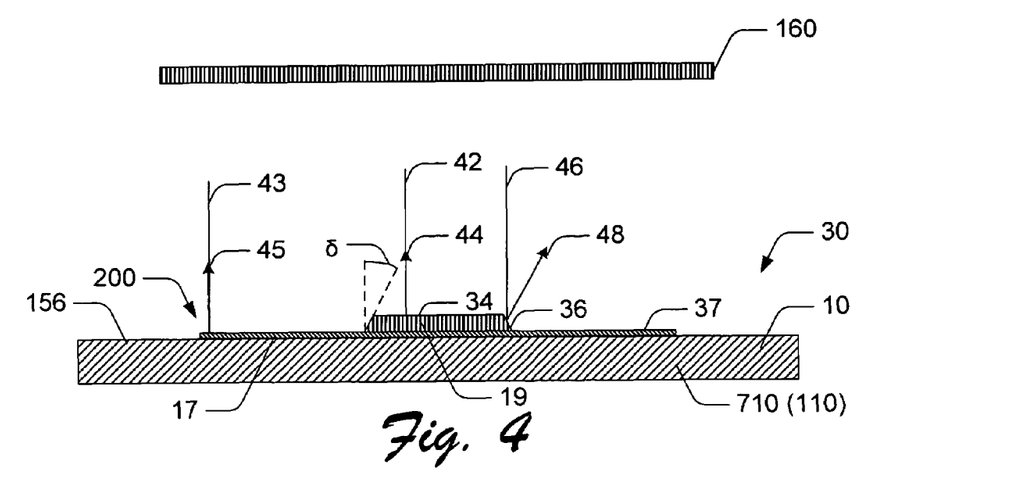
FIG. 4 is a cross-sectional view of the target shown in FIG. 3 that is being directly lit.
Figure 5:
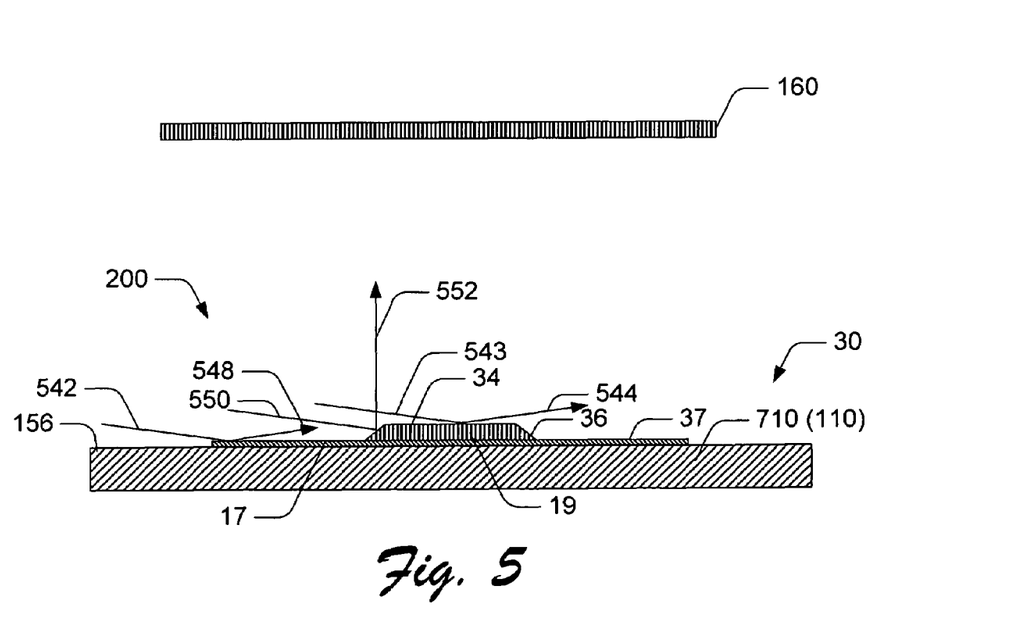
FIG. 5 is a cross-sectional view of the target shown in FIG. 3 that is being indirectly lit.

One embodiment of target 200 as illustrated in FIGS. 3, 4 and 5, is formed on a substrate 110 prior to the substrate being cut into wafers. Another embodiment of target is formed on a wafer 30 after the wafers are cut from a substrate. The disclosed embodiments of targets 200 are clearly identifiable to optical equipment and the like. The target 200 as shown in FIGS. 4 and 5 includes a thin film resistive layer 17 and a conductor layer 19. In one embodiment, the thin film resistive layer 17 is formed of a combination of tantalum and aluminum while the conductor layer 19 is formed from aluminum and copper. The conductor layer 19 and the thin film resistive layer 17 together form a raised portion on the upper surface 156 of the die 710 and at least partially define the target 200.

In one embodiment as described with respect to FIGS. 3, 4, and 5, the target 200 includes a central target region 34 formed on a portion of the outer surface of the conductor layer 19 that is substantially parallel to the upper surface 156. In one embodiment, the target 200 also includes an outer target region 37 that is substantially parallel to the upper surface 156. The outer target region 37 can be formed on the thin film resistive layer 17. In one embodiment, the target 200 also includes a sloped portion 36 that forms a periphery of the outer target region 37.

The sloped portion 36 slopes between the central target region 34 and an outer target region 37. In one embodiment, the diameter of the central target region 34 is 80 to 90 microns, the diameter of the thin film resistive layer 17 is 200 to 250 microns, the horizontal width (run) of the sloped portion 36 is 1 micron, and the vertical height (rise) of the sloped portion 36 is 0.5 micron.

To provide the optical functionality of the optical target 200, the central target region 34 is topographically configured to appear different to optical equipment than the sloped portion 36 under direct light, due to the angle of the different surfaces. For example, as illustrated in FIG. 4, a large amount of the direct light 42 that contacts the central target region 34 is deflected in a direction 44 that can be detected by the detector 160. A large amount of the direct light 43 that contacts the outer target region 37 is deflected in a direction 45 that can be detected by the detector 160.

By comparison, almost all direct light 46 that is directed toward the sloped portion 36 of the optical target 200 is deflected substantially in a direction 48 that is not directed at, or detectable by, the detector or sensor 160. As a result, where detector 160 is a light detector, the detector 160 does not detect direct light 46 that is deflected in direction 48.

When the optical target 200 formed on the upper surface 156 of the die 710 is exposed to indirect lighting as shown in FIG. 5, the indirect light 550, 542, and 543 is applied at an angle (typically greater than 20 degrees) from the perpendicular of the upper surface 156 of the die 710. In some embodiments, the indirect light is applied almost parallel to the upper surface 156 of the die 710. With indirect lighting, the indirect light 543 that deflects off the surface of the central target region 34 is directed as indicated by the arrow 544 in a direction such that the light is not detected by the detector 160. Similarly, the indirect light 546 that contacts the thin film resistive layer 17 located on the outer target region 37 follows a path 548 that is not detected by the detector 160. The central target region 34 and the outer target region 37 therefore both appear relatively dark to the detector 160 and/or observer under indirect light. A large percentage of the indirect light 550 that contacts the sloped portion 36 will be directed along path 552 towards the detector 160 (and thereby appear relatively bright to the detector under indirect light). The sloped portion 36 can thus be detected by the detector as an identifying shape of the target 200. The dimensions of the sloped portion 36, however, are often relatively small compared to the central target region 34 and the outer target region 37. As such, certain detectors may have difficulty detecting the outline of the sloped portion 36, and therefore the outline of the entire target 200 under indirect light.

In some indirect lighting situations, it may be difficult for optical detection equipment to accurately determine the precise position of the central target region 34, the sloped portion 36, and/or the outer target region 37. The use of this type of target 200 with indirect lighting produces a medium level contrast between the central target region 34 and the sloped portion 36.

In one embodiment, targets, as well as the area surrounding the targets, occupy considerable real estate on the wafer 30 or die that has been cut from the substrate 110. In one embodiment of an integrated circuit (IC) layout on the wafer 30 or die, no electric current path passes through target 200. Such a target may be referred to as "non-functional", because all electrical circuitry is routed around the target into a surrounding area of the wafer or die. For example, in FIG. 3, a spacing 38 represents the smallest designed distance between an electrical conductor 35 and the portion 37.

By using a relatively large die, it is relatively easy to provide a circuit layout in which functional optical targets 200 are positioned on (or adjacent to) the die without sacrificing much real estate that would otherwise be used for chip layouts. However, with the trend to smaller dice and resultant higher circuit densities, the optical targets consume a higher percentage of that valuable real estate, and their location may becomes problematic, particularly if the electric circuitry cannot be efficiently routed around the targets.

During normal wafer processing, the wafer is cut into a plurality of dice, wherein each individual die may become an integrated circuit (IC). Once the optical target is located, wafer processing equipment or tools such as photolithography equipment can be precisely located relative to the wafer, so that a die may be cut from a wafer, or a frame portion of the wafer.

In another embodiment of an integrated circuit (IC) layout on the wafer 30 or die, some optical targets may be configured to be electrically "functional", wherein a portion of an electrical circuit extends through a region of the wafer at which a target is located. It is possible to have more than one electronic circuit extending through an electrically functional optical target by providing a plurality of distinct electrically conductive layers; each electrically conductive layer may correspond to a distinct electronic circuit.

Within this disclosure, functional portions are considered those portions of the wafer 130 where electrical components and/or circuits exist that are capable of carrying electric current. Non-functional portions of the wafer 130 include those portions where electrical components and/or circuits do not exist. A region of a wafer is considered to be functional if there is at least one layer, of a vertically spaced plurality of layers, that is functional.

Figure 9:
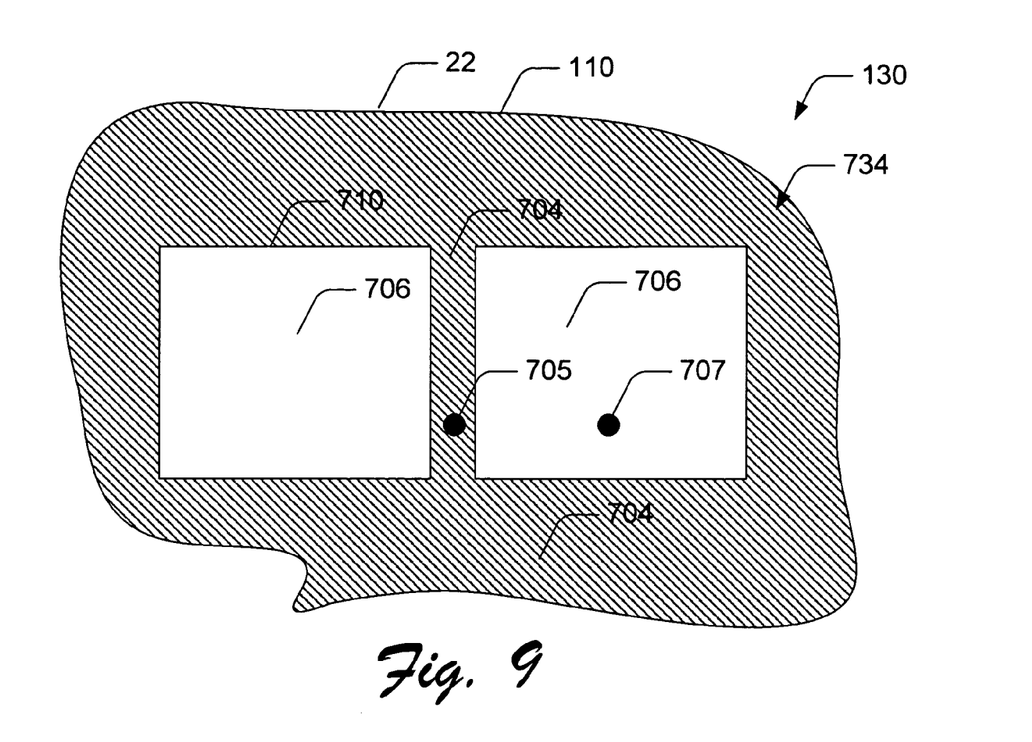
FIG. 9 shows a top view of one embodiment according to the present invention of a top cut-away portion of a wafer being subdivided into a plurality of dice, including a plurality of targets that can be positioned relative to individual dice in the wafer.

In one embodiment, the frame includes portions of the IC that are outside of the dice. As best understood with reference to FIG. 9, certain regions of the frame portion 704 such as the portion shown as 705 in FIG. 9 remain after the dice are cut or sawed from the wafer and can therefore maintain electrically functional portion 706 of the target. Certain other portions of the frame such as shown as 707 in FIG. 9 are typically destroyed by the sawing process as the dice are sawed from the wafer and are maintained within electrically non-functional portions of the target.

As such, regions of the frame portion 704 and regions of the dice within the wafer 130 may contain both electrically functional and electrically non-functional portions. In one embodiment of the present disclosure, a functional optical target 200 can be formed within the plurality of layers that are deposited on the substrate 110.

Figure 6:
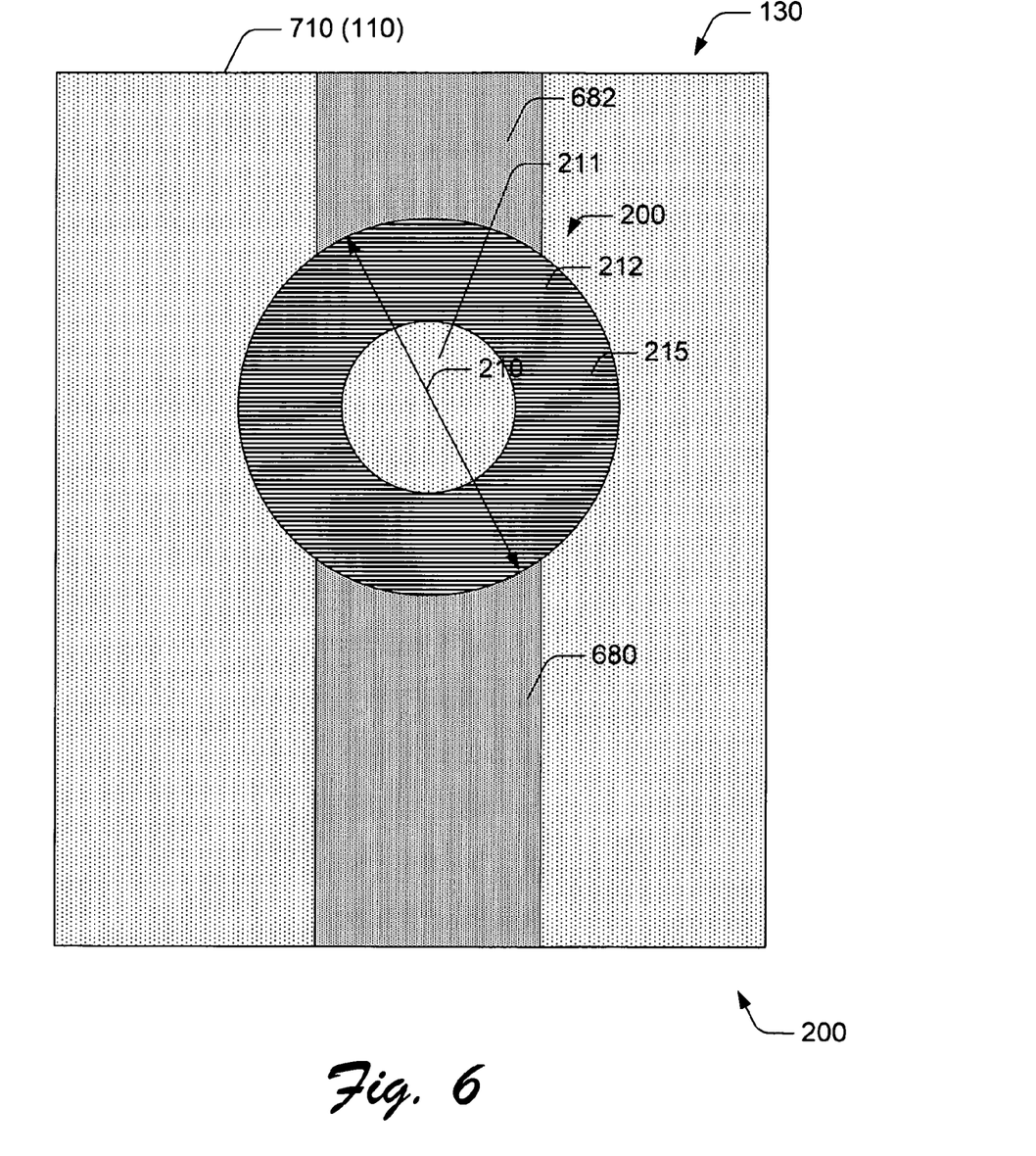
FIG. 6 is a top view of another embodiment according to the present invention of a target for use in a wafer of an IC.
Figure 7:
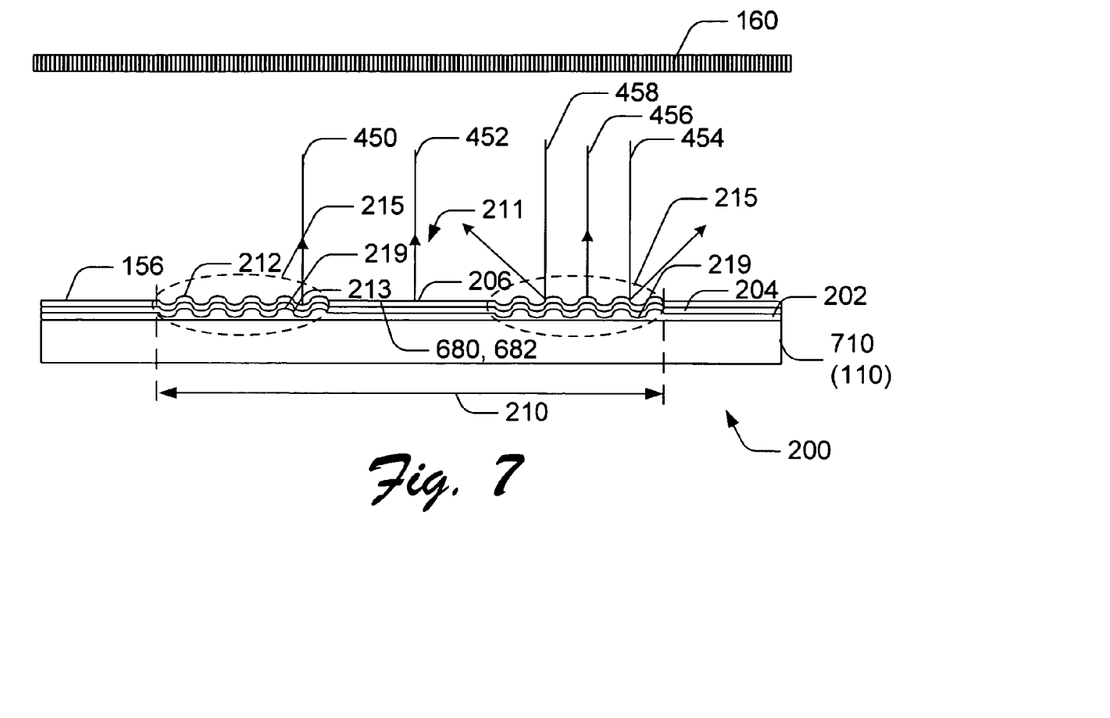
FIG. 7 is a cross-sectional view of the target shown in FIG. 6 that is being directly lit.
Figure 8:
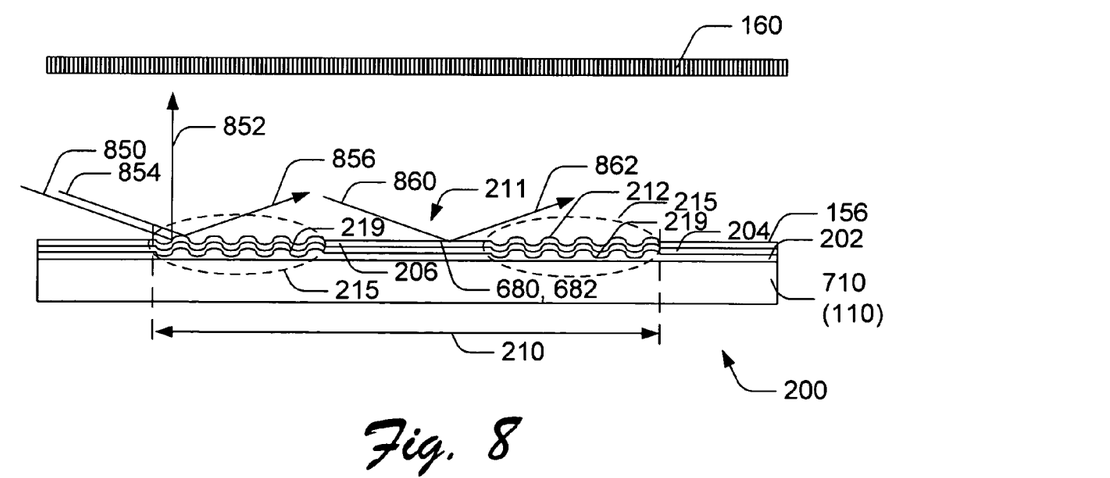
FIG. 8 is a cross-sectional view of the target shown in FIG. 6 that is being indirectly lit.

FIGS. 6, 7, and 8 illustrate a top view and two side views of another embodiment of an optical target 200 that is located on a wafer 130. In this embodiment, the optical target 200 includes a first layer 202, a second layer 204, and a third layer 206 that are each deposited (one on top of the prior one) on the substrate 110. In one embodiment, the first layer 202 and the third layer 206 are both formed from an electrically conductive material. In one embodiment, the second layer 204, illustrated between the first layer 202 and the third layer 206, is an electrical insulator layer that inhibits electrical conduction both through the second layer, and between the first layer and the third layer. The electrical conductor paths 680 and 682 as shown in FIG. 6 can be in electrical communication with either one of the electrically conductive layers 202 or 206 as shown in FIGS. 7 and 8. As such, an electrical current path, formed partially from the electrical conductor paths 680 and 682 can be created through the region of the target 200. Therefore, in certain embodiments of this disclosure, the region defined by the target 200 can provide electrical functionality.

Other embodiments of the present invention may include more than three layers, and more than two layers which are electrically conductive. An electrically conductive layer is typically separated from another electrically conductive layer by at least one electrically insulative layer.

The term "topography" as used in this specification with reference to the topographical region or contour 212 refers to any surface contour or feature that will produce light characteristics, or difference(s) in light characteristics, that can be optically detected. The topographical aspects of the optical target 200 that can be detected by the detector 160 or observer as described relative to FIGS. 1–5 are considered as the topographical contour 212. As such, the layer with the topographical contour 212 is the layer that reflects the direct or indirect light to be detected by the detector.

In those embodiments of optical targets in which the upper layer is not light transparent, the topographical contour 212 is on the upper-most layer. For instance, in the embodiment of target 200 shown in FIGS. 4 and 5 any topographical contour 212 is formed on the raised portion 34, 37, or 36, which is the upper-most non-transparent layer. In certain embodiments, one or more transparent layers can be applied above the topographical contour 212. These transparent layers have little effect on the optical functionality of the topographical contour 212 since light is readily transmitted through the transparent layers.

In this disclosure, a topographical pattern portion 219 is considered the structural layer on a die or wafer that creates the topographical contour 212. In those embodiments in which the uppermost layer is contoured to create the optical target, the topographical pattern portion 219 is the topographical contour 212. In other embodiments such as those shown in FIGS. 6, 7, and 8, the layer that is configured with the topographical pattern portion 219 may be one or more layers below the layer having the topographical contour 212. This disclosure therefore provides a variety of configurations in which the topographical pattern portion 219 providing the surface contour for the optical target 200 is formed on a layer that is not the upper-most non-transparent layer of the wafer 130.

The optical characteristics of the functional optical target 200 are produced by topographically contouring at least one of the layers 202, 204, or 206 such that the topographical contouring is visible when the upper surface of the wafer is observed. In one embodiment, the topographical contouring 212 is implemented on the upper surface of the first layer 202. The general contour of the topographical contour may be mirrored through the layers above the layer being contoured (e.g., the second layer 204 and the third layer 206). Depending on the depth and manner of deposition of the upper layers 204 and 206, a patterned upper surface defining a portion of the upper surface of the upper layer 206 will closely follow the topographical contour 212.

In one embodiment, a patterned topographical contour 212 is formed by patterned surface irregularities (such as the topographical contour 212 having a sinusoidal contour). In another embodiment, the patterned topographical contour 212 is formed by providing multiple strips 213 of a material that are arranged in a substantially parallel pattern (or in some other recognizable pattern) within the topographical contour, as described relative to FIG. 13. In another embodiment, a topographical contour can be created in a two-dimension pattern as described relative to FIG. 14. It is envisioned that the general pattern of the topographical shapes is illustrative in nature, and not limiting in scope. The particular configuration, pattern, or depth is a design choice that could be selected by one skilled in semiconductor manufacturing processes.

FIG. 7 illustrates one embodiment of a die or wafer 710 upon which direct light is applied. In FIG. 7, the topographical pattern portion 219 is formed in a lower layer that is one or more layers below the layer having the topographical contour 212. As such, the direct light reflects off the topographical contour 212 in a direction that is a function of the angle of the topographical contour at the position that the direct light contacts. Multiple rays of direct light that are applied to the wafer of die 710 are provided with the reference characters 450, 452, 454, 456, and 458. The arrowheads corresponding to the direct light paths 450, 452, 454, 456, and 458 indicate the direction of travel after the direct light reflects off the surface of the wafer or die 710. The direct light paths 450, 452, 454, 456, and 458 impinge on the topographical contouring 212 that is configured in a shape that is determined by the topographical profile 219.

In a similar manner as previously described in other direct light embodiments of the present invention, in the embodiment shown in FIG. 7, those areas of the patterned topographical contour 212 which are substantially horizontal will deflect the greatest percentage of light, and will appear relatively bright. Examples of a portion of the patterned topographical contour 212 that are substantially horizontal in FIG. 7 include the central portion 211 toward which direct light 452 is directed, and the upper portion or the lower portion of a sinusoidal pattern or another alternating pattern of the patterned topographical contour 212 toward which light such as 450 or 456 is directed. In FIG. 7, 454 and 458 represent direct light deflecting off angled surfaces of the patterned topographical contour 212. Those areas that are angled relative to horizontal will deflect less direct light towards the detector, and will thus appear relatively dark. If such patterns are arranged in a regular configuration, the outline of the optical target becomes evident to a detector 160 or observer. The topographical contouring is contained within a target footprint 210. The target footprint 210 extends vertically, and laterally and includes all of the topographical contours 212 (for the target) contained on the wafer 130.

FIG. 8 illustrates one embodiment of a die or wafer 710 upon which indirect light is applied. In FIG. 8, the topographical pattern portion 219 is formed in a lower layer that is one or more layers below the layer having the topographical contour 212. As such, the indirect light reflects off the topographical contour 212 in a direction that is a function of the angle of the topographical contour at the position that the indirect light impinges. Multiple rays of indirect light that are applied to the wafer of die 710 are provided with the reference characters 850, 854, and 860. The arrowheads on paths 852, 856, and 862 (which respectively correspond to the indirect light paths 850, 854, and 860) indicate the direction of travel of the light after the indirect light reflects off the surface of the wafer or die 710. The indirect light paths 850 and 854 impinge on the topographical contouring 212 that is configured in a shape determined by the topographical profile 219.

In the embodiment shown in FIG. 8, indirect light 850, 854, and 860 is applied to the upper surface of the die 710. In one embodiment, the indirect light 860 is deflected off the central portion 211 (which is between a pair of topographical contours 212) at an angle that does not reach the detector 160. As such, the central portion 211 appears relatively dark to the detector 160. For a similar reason, any surface on the upper surface 156 of the die 710 that is substantially parallel to the general outline of the upper surface of the die 710 will appear as relatively dark.

Figure 13:
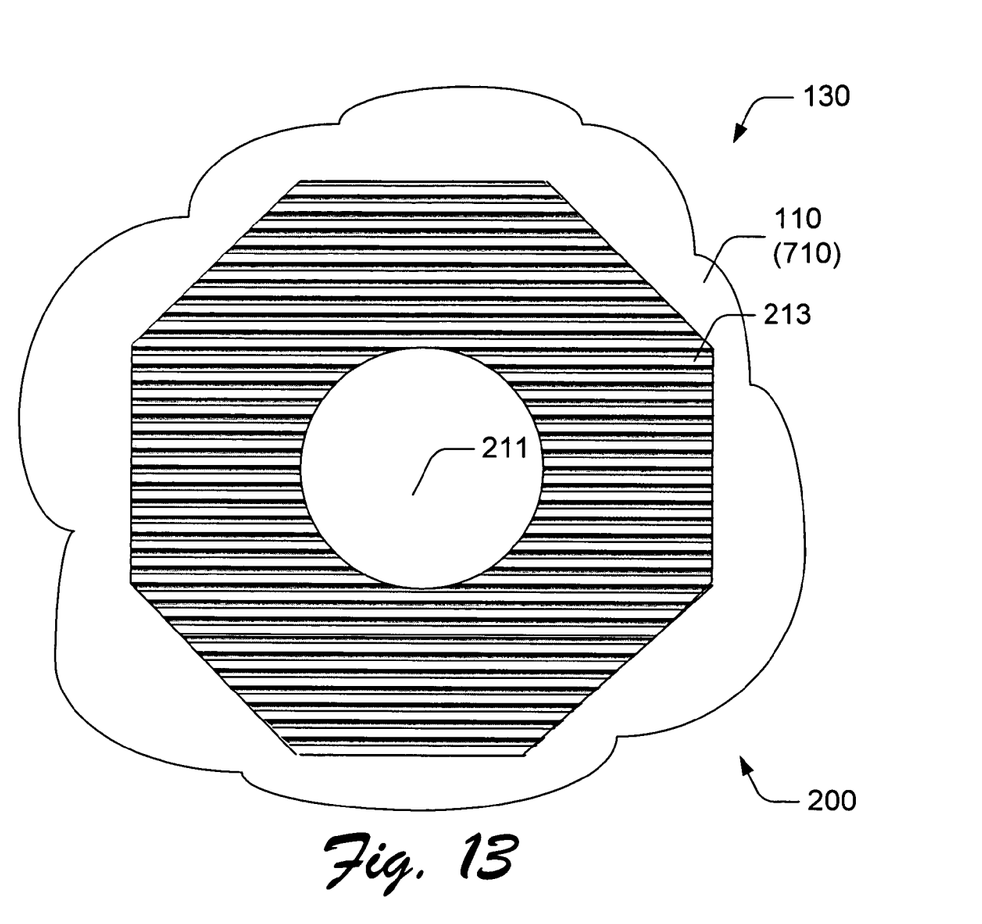
FIG. 13 shows a top view of the upper surface of one embodiment according to the present invention of a target that is to be positioned within, or relative to, a die or wafer.
Figure 14:
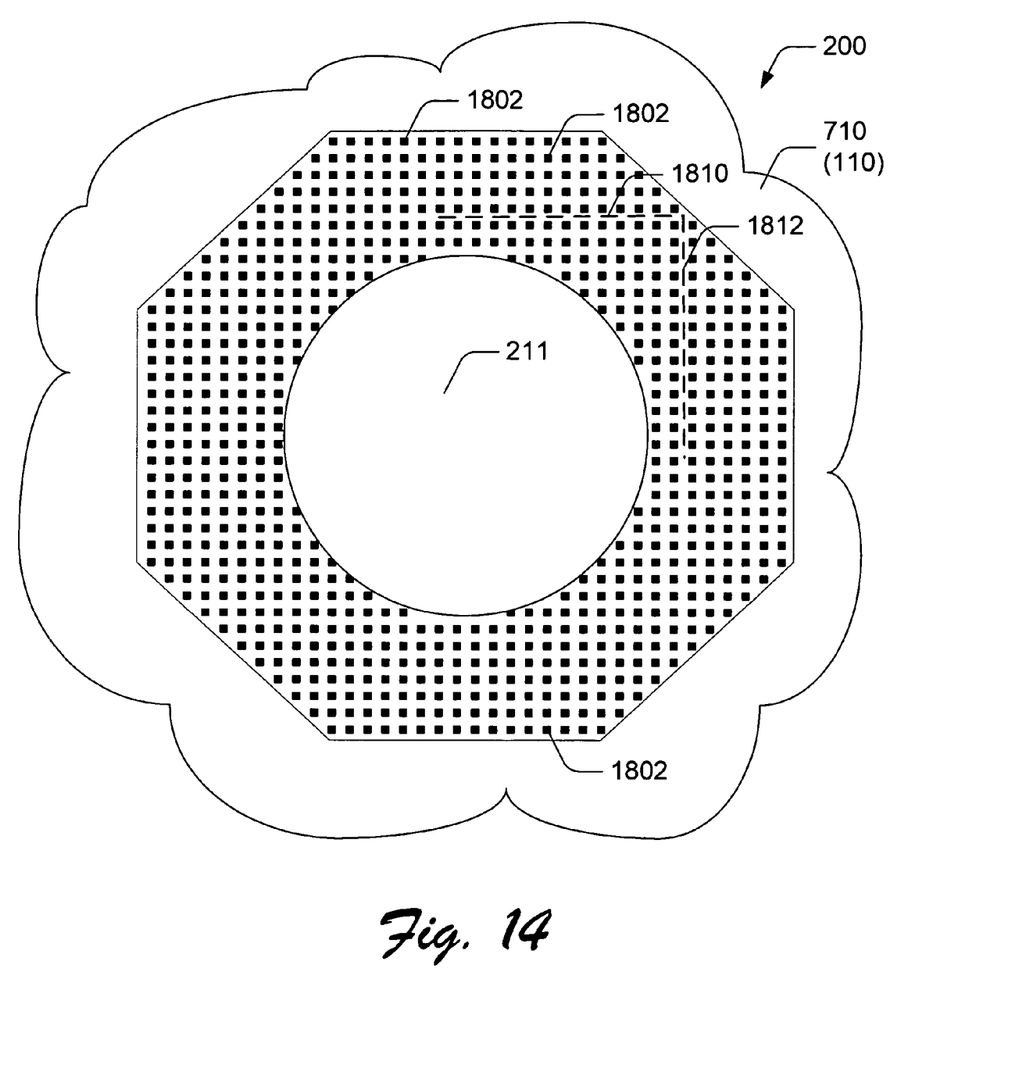
FIG. 14 shows a top view of the upper surface of another embodiment according to the present invention of a target that is to be positioned within, or relative to, a die or wafer.

In one embodiment, indirect light 850 and 854 that contacts the patterned topographical contour 212 within the topographical region 215 will deflect light in a variety of directions based on the angle at which the indirect light 850 and 854 is applied and the angle of the particular portion of the topographical contour 212 impinged by the light. Much of the surface area of the topographical contour 212 will deflect indirect light 854 in a direction indicated by arrow 856 that is generally away from the detector 160. Those portions of the topographical contour 212 that are angled to the direction at which the indirect light 850 is reflected are indicated by arrow 852 that is directed towards the detector 160. As such, within the topographical contour 212, certain regions that are angled at a suitably selected direction will appear relatively bright to the detector. In those embodiments in which the topographical contour 212 is arranged in a specific pattern (e.g., sinusoidal as shown in FIGS. 8 and 13 or a grid pattern as shown in FIG. 14), the few regions within the topographical contour 212 that appear relatively bright will also be configured in a pattern that can be recognized by the detector.

In one embodiment, the embodiment of topographical pattern portion 219 (and the corresponding topographical contour 212) shown in FIGS. 7 and 8 is generally sinusoidal. In these embodiments, the topographical contour 212 is formed in the upper non-transparent layer off which light can reflect (in different embodiments, the first layer 202, the second layer 204, or the third layer 206). There are many other embodiments of shapes of topographical contours 212 that are within the intended scope of the present disclosure. For instance, the topographical contour could be a sinusoid, a square wave, a frustro saw-tooth configuration, or another similar pattern that deflects light in a regular and recognizable configuration. In one embodiment, the shape of the topographical pattern portion 219 can thereby be considered as being "projected" through multiple layers to be contoured by virtue of being deposited on the contoured layers below on the wafer or die 710. In one embodiment, a regular pattern or contour can therefore extend through one or more layers to the upper-most layer. In another embodiment, the topographical contour 212 can be arranged as a two-dimensional repeating grid pattern as illustrated in FIG. 14. It is envisioned that the pattern of the topographical pattern portion 219 (and the corresponding topographical contour 212) can be any recognizable pattern of shape that can be detected by an optical detector or observer.

In the embodiments of optical targets 200 as illustrated in FIGS. 7 and 8, one or more layers may be applied between the layer creating the topographical pattern portion 219 and the layer forming the topographical contour 212. These layers may be deposited using known semiconductor processing techniques in alternating insulator and conductor configurations. As such, in one embodiment, one or more electrically-conductive layers may horizontally extend through the region defined by the optical target 200 (in one embodiment delineated by the horizontal outline of the topographical pattern portion 219). In this embodiment, the electrical conductors used in the electrical circuit layouts can be configured or routed through the locations of the optical targets where it is electrically advantageous to do so, rather than being disadvantageously routed around the targets. To provide one embodiment of an optical target 200 that is electrically functional, electrical conductors physically contact an electrically conductive layer of the optical target, wherein an electric voltage can be applied across the layer of functional optical target 200.

As such, an electric current can be designed to flow across one or more layers of the functional optical target 200. The electric current can flow through at least one electrically conductive layer that is located above, below, or within the topographical pattern portion 219 of the functional optical target 200.

Another embodiment of a technique to create the electrical conductors is to pattern the optical target so that certain electrically conductive portions of the first layer 202 or the third layer 206 are patterned outside of the target footprint 210 as well as inside the footprint 210. For instance, the third layer 206 can provide a continuous electrical conductor from one side of the target footprint 210, through the target footprint 210 formed by one or more topographical contours 212, to another side of the target footprint. Due to the configuration of the optical target 200, the first layer 202 and/or the third layer 206 can extend to those portions of the wafer 130 that are laterally outside of the target footprint 210 to form an electrical conductor.

Figure 12:
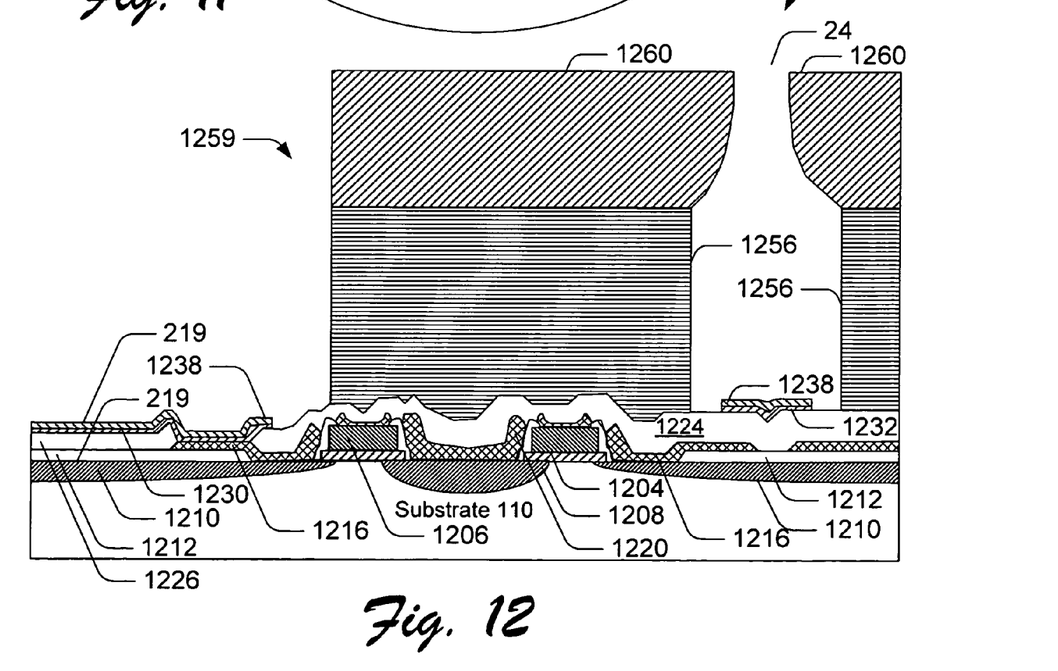
FIG. 12 shows a cross-sectional view of one embodiment according to the present invention of a die or wafer having a portion of an optical target formed thereupon.

Metal-oxide semiconductor (MOS) represents one embodiment of technology that is used to create multiple electrically conductive layers, electrically insulative layers, and/or electrical semiconductor layers on a substrate 110. There are a variety of embodiments of semiconductor technologies that are closely related to MOS technology including, but not limited to, metal-oxide semiconductor field effect transistor (MOSFET), metal-insulator semiconductor (MIS), and combined metal-oxide semiconductor (CMOS). MOS technology, in general, can be applied to certain printers, such as ink jet printers. Using MOS technology, the IC components are created by a progression of layers being deposited on the substrate 110, and portions of the layers being etched, into a device as illustrated in FIG. 12.

In one embodiment, the functional portions of the wafer 130, including functional optical targets, are included within each integrated circuit (IC). Each IC, in turn, is formed within a die. The frame portions of the wafers 130 are typically discarded after the dice are sawed from the wafers. In one embodiment, certain portions of the frame may also be electrically functional at certain times since metrology may be located on the frame to test the components prior to the dice being sawed from the wafer 130.

In one embodiment, the functional optical target 200 (as delineated by the topographical contours 212) is contained within the target footprint 210 formed on the die or frame. The target footprint 210 is defined by a central portion 211 and a surrounding contrasting region 215. From above, in certain embodiments, the surrounding contrasting region 215 visibly contrasts from the central portion 211 wherein the two portions can be differentiated by an optical detector and/or by a human eye to identify the location of the optical target 200. The topography of one or more of the layers is used to provide the optical contrast between the central portion 211 and the surrounding contrasting region 215.

The above describes a variety of embodiments of the optical target 200 being applied to a variety of dice 710 or wafers. These dice 710 or wafers can be used for a variety of applications. In one embodiment, the integrated circuit including optical target 200 is applied to a printer circuit. One exemplary embodiment described herein involves functional optical targets 200 applied to the IC portion that serve as orifice alignment targets for a printhead portion of a print cartridge or "pen" used in an ink jet printer. It is recognized and understood that the embodiments are equally applicable to other integrated circuit (IC) applications as well.

In certain embodiments, ICs are often fabricated from the wafer that is subdivided into a plurality of dice 710 as shown in FIG. 9. As shown in the embodiment in FIG. 9, the IC 22 is subdivided into a plurality of dice 710 (such as printheads) and multiple frame portions 704. The dice include a functional portion 706 that is produced by fabricating the wafer 130. The frame 704 corresponds to those wafer 130 portions that extend between different dice 710. In certain embodiments, the frame 704 contains electronic circuits that allow for testing devices (i.e., metrology tools) to be applied to the functional portion prior to cutting the wafer 130 to form the dice 710 in order to verify that the dice 710 are operational. In one embodiment, during wafer fabrication, a wide variety of processes can be used to fabricate the dice 710. These processes generally include a variety of material deposition and etching processes. Examples of the material processing technologies include physical vapor deposition, chemical vapor deposition, electro-chemical deposition, ion implantation, and so forth. In certain embodiments, the patterns that are provided across different portions of the die in electrical insulator, electrical conductor, and electrical semiconductor materials provide the functionality of the electronic circuitry 706. In one embodiment, photolithography can be used to precisely define where different electrical insulators, electrical conductors, and/or electrical semiconductor materials will be etched. To provide high yields of ICs, similar photolithographic patterns are typically created at multiple locations (i.e., within different dice 710) across a single wafer 130.

Figure 10:
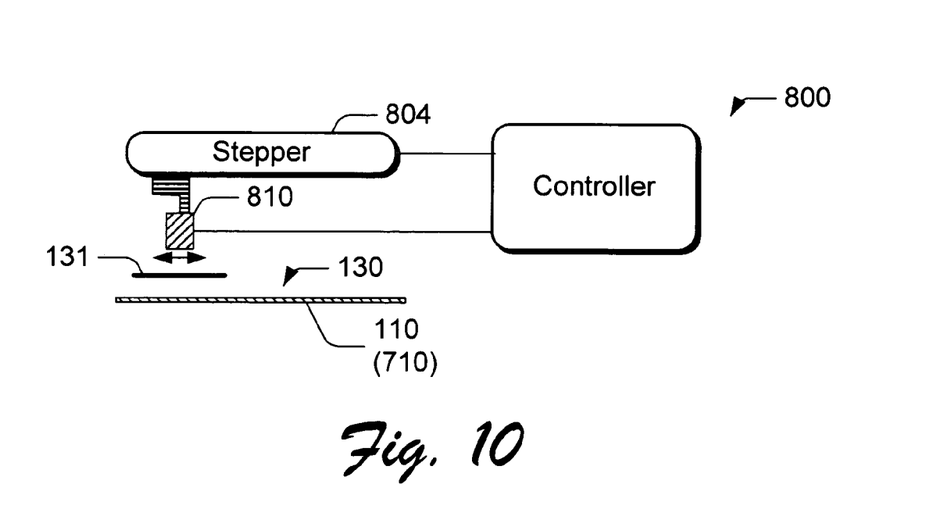
FIG. 10 shows a schematic diagram of one embodiment according to the present invention of a target sensor device that may be used to sense the location of the target upon the IC.

One embodiment of a wafer processing device 800 is shown in FIG. 10, and is used as part of various processes (e.g., photolithography) as applied to the wafer 130. In one aspect, distinct wafer processing tools can deposit, and then precisely etch, regions of certain layers deposited on the wafer. In one embodiment, the wafer processing device 800 includes a stepper 804 that displaces wafer processing equipment 810 including a mask 131 relative to the wafer 130 in a step-like fashion so that one die is typically being processed at a time in a particular wafer. In one embodiment, to develop certain regions on each die, the light is then applied through the mask 131 so light can pass through those portions of the mask that have openings and the light will impinge on certain surface locations of the die.

Light will not pass through those portions of the mask 131 that do not have openings. Following the development of certain die locations, the stepper then precisely transfers the mask to be aligned with another location on the wafer, and often performs another similar process on another die on the wafer. Certain embodiments of processes such as physical vapor deposition, chemical vapor deposition, electro-chemical deposition, ion implantation, and photolithography are generally known in the semiconductor processing industry, and will not be further described herein.

Figure 11:
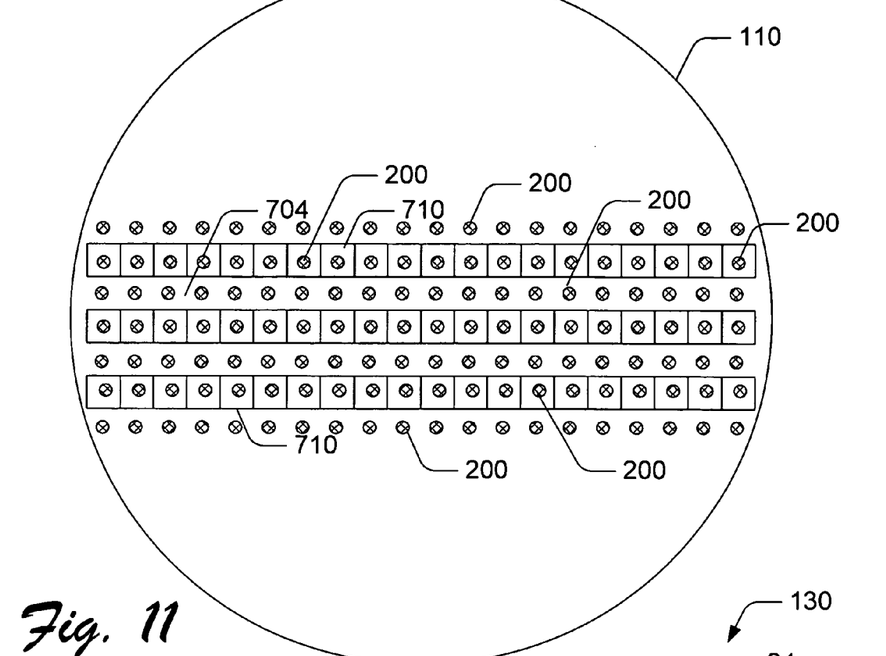
FIG. 11 is a top view of another embodiment according to the present invention of a wafer being subdivided into a plurality of dice, and a variety of target positions that the target can be positioned relative to individual dice in the wafer.

In one embodiment, the functional optical target 200 is used, e.g., during the photolithographic processes, to locate the wafer processing device 800 shown in FIG. 10 relative to the die 710 or wafer. As illustrated in FIG. 11, the functional optical target 200 may be positioned on the die 710 (where several optical targets 200 are shown). Alternatively, certain optical targets 200 may be located on portions of the frame 704 that is located on the wafer 130 between multiple dice. In one embodiment, the die becomes integrated within, and forms a portion of, the integrated circuit. The frame 704 represents in one embodiment that waste portion of the wafer 130 that is left over following removal of the dice. In certain designs, the entirety of all of the dice is considered the functional portion of the wafer 130 while the frame is the non-functional portion of the wafer.

FIG. 12 shows an embodiment of a substrate 110 upon which multiple layers are applied to fabricate, e.g., a fluid ejection device 1259. The substrate can be provided with an optical target 200 formed thereon. The optical target can be located underneath a fluid ejection device 1259 or laterally of the fluid ejection device.

In certain embodiments, the substrate 110 has multiple layers formed thereupon. The optical target 200 can be configured to act as the orifice alignment targets which are commonly used in such applications as print heads. However, fabrication concepts described relative to FIG. 12 apply to other devices. Optical target concepts can be applied to integrated circuits (ICs) in general.

In one embodiment, the die is formed as a plurality of conductive layers and insulator layers that are deposited on a substrate 110. The substrate 110 may include or be formed from such semiconductor materials as silicon, gallium arsenide, sapphire, a variety of other materials, or a combination of several such materials. In one embodiment, the layers are deposited, etched, and otherwise processed using metal-oxide-semiconductor (MOS) technologies. While these exemplary layers described herein represent known and effective semiconductor, insulator, or electrical conductor layers, it is emphasized that other known layers may be used while remaining within the intended scope of the invention.

In one embodiment, the layers that are deposited on the substrate 110 include electrical conductor layers, electrical insulator layers, and/or semiconductor layers. One embodiment of the substrate 110 can be patterned to create the topographical pattern portion 219. The substrate 110 is considerable thicker than the other layers formed above the substrate (excepting the orifice plate 1260 and the barrier layer 1256). As such, the optical target 200 is laterally spaced from the orifice plate 1260 and the orifice plate barrier layer 1256.

In one embodiment, a gate oxide insulator layer 1204, a source oxide insulator layer 1208, and a drain oxide insulator layer 1210 operationally form, for example, a metal-oxide-semiconductor (MOS) transistor is patterned and etched on the substrate 110. The layers that are formed on the substrate 110 as shown in FIG. 12 include in one embodiment, from bottom to top, a thick oxide (or gate oxide) insulator layer 1204, a polysilicon conductor layer 1206, the source 1208, the drain 1210, a glass insulator layer 1212, a conductor layer 1216, a first passivation insulator layer 1224, a second passivation insulator layer 1226, an anti-cavitation conductor layer 1230, a surface or gold conductor layer 1238, a barrier layer 1256, and an orifice plate 1260. The orifice plate 1260 is formed with an orifice nozzle 24 from which ink is projected.

Certain of the layers described relative to FIG. 12 are particularly directed to fluid ejection-based embodiments of IC processing (e.g., the barrier layer 1256 and the orifice plate 1260). Certain embodiments of IC processing may utilize different layers, materials, and/or dimensions based on the specific function and fabricator of the IC. For example, certain IC processes would deposit and/or etch protective polymers instead of such layers as the barrier layer 1256 and/or the orifice plate 1260. Certain embodiments of protective polymers may include Parylene or transparent epoxies. As such, the specific layers described relative to FIG. 12 are illustrative in nature, and are not limiting in scope. Any IC configuration including the targets as disclosed herein that are fabricated using a series of deposition and etching processes are within the intended scope of the present invention.

In certain embodiments, electrically functional portions of the wafer 130 are contained within the dice 710 as illustrated in FIG. 9. By comparison, the frame portion 704 (which is discarded following processing and cutting the dice 710 from the wafers 130) generally does not have any electrically functional portions. As it is desired to increase the number of dice 710 produced from a wafer of a given dimension, it is natural for designers to decrease the dimensions of the frame portion 704. By decreasing the frame size, a multi-layered functional optical target 200 of a fixed size may no longer fit within the frame 704 between the dice 710.

FIGS. 13 and 14 schematically illustrate the appearance of embodiments of optical target 200 to a light sensor such as is used in the wafer processing device 800 shown in FIG. 10. The optical target 200 shown in FIGS. 13 and 14 may include electrically conductive paths integrating any of the electrically conductive layers formed thereon. As such, in certain embodiments, the optical target "optically appears" the same regardless of which electrically conductive layers (such as shown and described relative to FIG. 12) are configured to have electric current flow therethrough. Providing multi-layered optical targets 200 as illustrated in FIGS. 13 and 14 allows for a more effective use of the real estate on the die, and therefore provides for an increased area of conductor layers 1206, M1, or M2 on each die that can be made electrically functional. The optical targets can be provided in an extremely wide range of embodiments, dimensions, and configurations.

FIGS. 13 and 14 illustrate two exemplary embodiments of targets 200 that are arranged to be detectable under both direct lighting and indirect lighting conditions. The embodiment of target as illustrated in FIG. 13 includes the patterned topographical contour 212 that deflects light in a patterned shape as discussed relative to FIGS. 7 and 8 above. The cross sectional shape of the sinusoidal topographical contour 212 shown in FIG. 13, under direct lighting, will appear as strips 213 of alternating brighter and darker regions, while the central portion 211 will appear relatively bright. Under indirect lighting, the embodiment of pattern of FIG. 13 will appear as generally dark, except for certain regions within each pattern that are angled at a suitable angle relative to the indirect light to appear bright. The central portion 211 appears relatively dark under indirect lighting. The pattern of the target 200 as shown in FIG. 13 can be easily identified using either indirect or direct lighting.

Instead of the alternating sinusoidal pattern as described relative to FIGS. 7, 8, and 13, the target 200 as illustrated in FIG. 14 is arranged with a plurality of indentations 1802 formed in an upper surface of the die 710. The indentations may be indented, for example, in the polysilicon conductor layer 1206 as described above. The pattern of the indentations may be viewed, in cross-section, as being substantially sinusoidal, saw-shaped, or some other pattern as taken parallel to each one of two perpendicular directions as indicated 1810, 1812. One embodiment of indentations 1802 includes indentations arranged in a grid pattern. Any recognizable three-dimensional grid pattern (e.g., alternating offset rows, etc.) are within the intended scope of the pattern of the indentations 1802 of this disclosure.

Under direct lighting, the cross sectional shape of the embodiment of grid-pattern topographical contour 212 shown in FIG. 14 will appear as a varying grid of relatively darker patterns corresponding to those surfaces that are angled relative to the upper surface of the die 710. A relatively brighter pattern will correspond to those portions corresponding to those surfaces that are substantially parallel to the upper surface of the die. In one embodiment, the surfaces that appear relatively brighter under direct lighting may include those surfaces that are within the indentations 1802 (such as a planar bottom of the indentation), as well as those surfaces that are on the planar surface outside of the indentations. The embodiment of central portion 211 will appear relatively brighter under direct lighting.

Under indirect lighting, the embodiment of pattern of the indentations 1802 of FIG. 14 will appear as generally relatively darker, except for certain regions within each indentation that are angled within a suitable range of angles relative to the indirect light which will appear relatively brighter to a detector or observer. Presuming that the indentations 1802, in cross-section along lines 1810 and 1812, have a sinusoidal grid-like pattern, the target 200 will appear under indirect light as a relatively brighter region from the portion of the indentation that is angled relative to the light to deflect the light to the detector. In one embodiment, the central portion 211 appears relatively darker under indirect lighting. The pattern of the target 200 as shown in FIG. 14 can be easily identified using either indirect or direct lighting.

Although the disclosure has been described in language specific to structural features and/or methodological steps, it is to be understood that the appended claims are not limited to the specific features or steps described. Rather, the specific features and steps are exemplary forms of implementing this disclosure.

The invention claimed is:

1. An optical alignment target formed on a substrate, the target comprising:
   a planar central portion; and
   a contoured contrasting region that surrounds the planar central portion, the contoured contrasting region being formed from a first layer deposited on the substrate, a second layer deposited on the the first layer, and a third layer deposited on the second layer, the first layer having a topographic contour that forms patterned surface irregularities on an upper surface of the first layer, the second and third layers each having a topographic contour that generally mirrors the topographic contour of the first layer as a result of the second and third layers having been deposited on the first layer such that upper surfaces of the second and third layers have contours that follow contours of the upper surface of the first layer;
   wherein the optical alignment target can be readily detected from the contrast between the planar central portion and the contoured contrasting region that surrounds the planar central region.

2. The target as set forth in claim 1, wherein the topographic contours comprise sinusoidal contours that reflect light in a manner in which a plurality of alternating relatively brighter and relatively darker sections can be detected.

3. The target as set forth in claim 1, wherein the topographic contours comprise a plurality of indentations that are arranged in a grid pattern.

4. The target as set forth in claim 1, wherein the first layer is an electrical conductor, the second layer is an electrical insulator, and the third layer is an electrical conductor.

5. The target as set forth in claim 1, wherein the second layer includes an electrical conductor.

6. The target as set forth in claim 1, wherein electrical current flows through at least one of the first layer and the third layer.

7. The target as set forth in claim 1, wherein the substrate is segmented into at least one electrically functional portion and at least one electrically non-functional portion.

8. The target as set forth in claim 7, wherein the target is at least partially located on the electrically functional portion.

9. The target as set forth in claim 1, wherein at least a portion of the third layer is recessed.

10. The target as set forth in claim 1, wherein the topographic contours form repeated peaks and troughs.

11. The target as set forth in claim 1, wherein at least one of the second and third layers is transparent.

12. A method of manufacture of a target, comprising:
    depositing a first layer on a substrate;
    forming a topographic contoured contrasting region on an upper surface of the first layer, the contoured contrasting region surrounding a planar central portion of the first layer and defining patterned surface irregularities; and depositing a second layer on the first layer, the second layer having a topographic contour in the contoured contrasting region that generally mirrors the topographic contour of the first layer as a result of the second layer having been deposited on the first layer, such that a portion of an upper surface of the second layer has contours that closely follow contours of the upper surface of the first layer, wherein the target can be readily detected from the contrast between the planar central portion and the contoured contrasting region that surrounds the planar central region.

13. The method as set forth in claim 12, wherein the forming the first layer includes forming a sinusoidal pattern in the upper surface of the first layer that reflects light in a manner in which alternating strips of relatively bright light and relatively dark light appear when light is applied at the target.

14. The method as set forth in claim 12, wherein the forming the first layer includes forming indentations in the first layer that are arranged in a grid pattern.

15. A target formed on a substrate comprising:
- a first layer deposited below a second layer on the substrate, the second layer deposited below a third layer on the substrate, the first layer having the topographic contour formed thereon, the first layer at least partially projecting a patterned topographical contour through the second layer to the third layer;
- a barrier layer disposed above the second layer; and
- an orifice plate disposed above the barrier layer.

16. The target as set forth in claim 15, wherein the target is an orifice alignment target.

* * * * *

UNITED STATES PATENT AND TRADEMARK OFFICE
CERTIFICATE OF CORRECTION

| | | |
|---|---|---|
| PATENT NO. | : 7,247,952 B2 | Page 1 of 1 |
| APPLICATION NO. | : 10/697394 | |
| DATED | : July 24, 2007 | |
| INVENTOR(S) | : Simon Dodd et al. | |

It is certified that error appears in the above-identified patent and that said Letters Patent is hereby corrected as shown below:

In column 14, line 19, in Claim 1, after "on" delete "the".

Signed and Sealed this

Fifteenth Day of July, 2008

JON W. DUDAS
*Director of the United States Patent and Trademark Office*